United States Patent
Mauthe et al.

(10) Patent No.: US 7,737,755 B2
(45) Date of Patent: Jun. 15, 2010

(54) LEVEL SHIFTING

(75) Inventors: Manfred Mauthe, Aying (DE); Henrik Icking, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/766,411

(22) Filed: Jun. 21, 2007

(65) Prior Publication Data

US 2008/0315936 A1  Dec. 25, 2008

(51) Int. Cl.
*H03L 5/00* (2006.01)

(52) U.S. Cl. .............................. 327/333; 326/63; 326/81

(58) Field of Classification Search .................. 327/306, 327/333; 326/80–81, 62–63
See application file for complete search history.

(56) References Cited

U.S. PATENT DOCUMENTS

| | | | |
|---|---|---|---|
| 6,236,250 B1 | 5/2001 | Salmon et al. | |
| 6,351,173 B1 * | 2/2002 | Ovens et al. | 327/333 |
| 6,359,493 B2 | 3/2002 | Satomi | |
| 6,771,110 B2 | 8/2004 | Golliher et al. | |
| 6,803,801 B2 * | 10/2004 | Randazzo et al. | 327/333 |
| 6,906,552 B2 | 6/2005 | Ajit | |
| 7,034,585 B1 | 4/2006 | Kiani | |
| 7,227,400 B1 * | 6/2007 | Gillespie et al. | 327/333 |
| 2006/0091906 A1 | 5/2006 | Tanaka et al. | |

FOREIGN PATENT DOCUMENTS

| | | |
|---|---|---|
| DE | 102005024955 | 12/2006 |
| JP | 2004260242 | 9/2004 |
| JP | 2005175752 | 6/2005 |
| JP | 2006203503 | 8/2006 |

OTHER PUBLICATIONS

Otsuka, et al., "Circuit Techniques for 1.5-V Power Supply Flash Memory", IEEE Journal of Solid-State Circuits, vol. 32, No. 8, Aug. 1997, pp. 1217-1229.
Figure for Information Disclosure Statement, of system used commercially prior to filing date of present application.

* cited by examiner

*Primary Examiner*—Dinh T. Le
(74) *Attorney, Agent, or Firm*—Banner & Witcoff, Ltd.

(57) ABSTRACT

Various aspects are described, such as a method for operating a level shifter, in which the level shifter is coupled to a first supply voltage and a second supply voltage different from the first supply voltage. The method may include detecting whether the first supply voltage is present, and decoupling an input of the level shifter from an output of the level shifter responsive to detecting that the first supply voltage is not present.

17 Claims, 14 Drawing Sheets

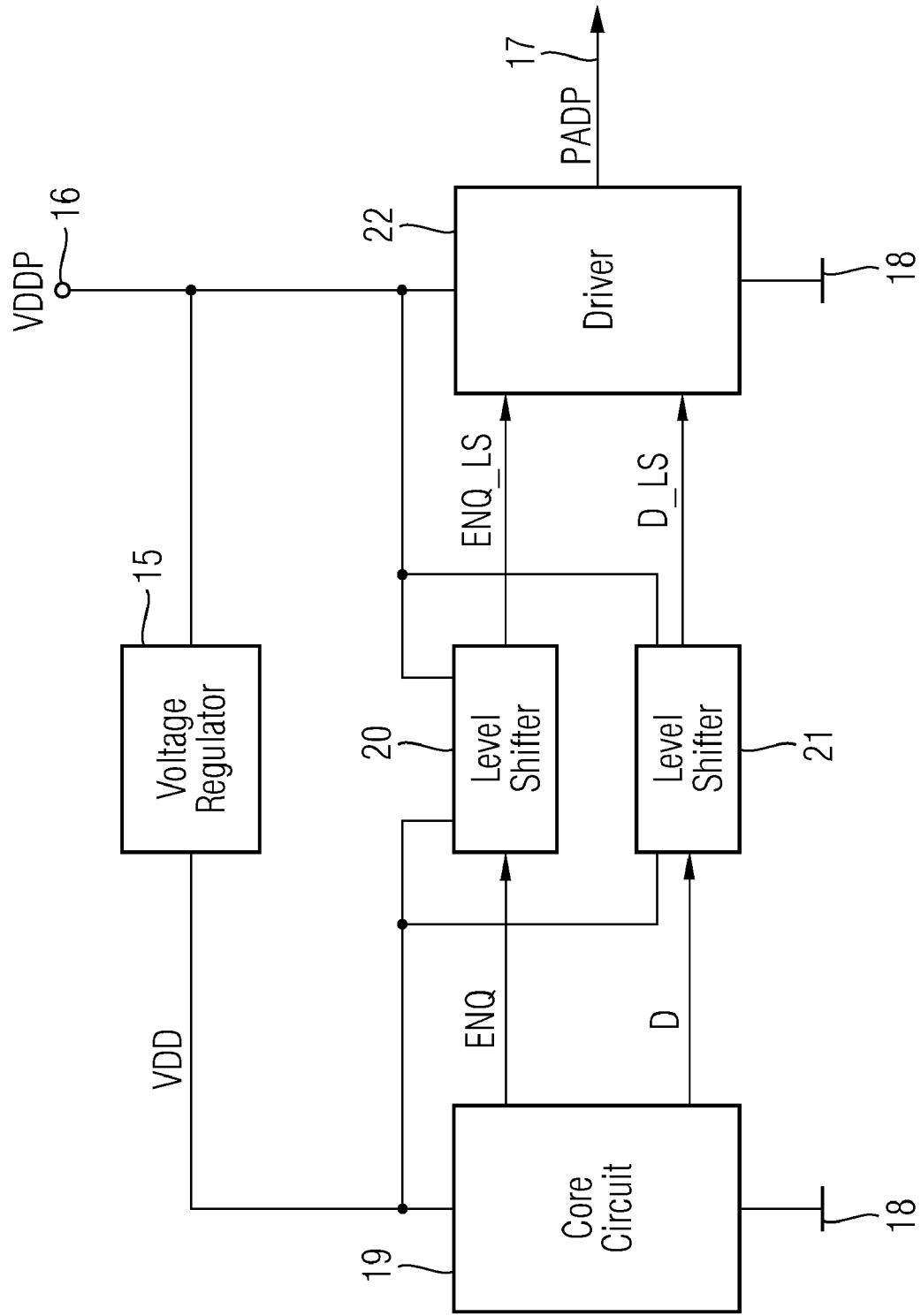

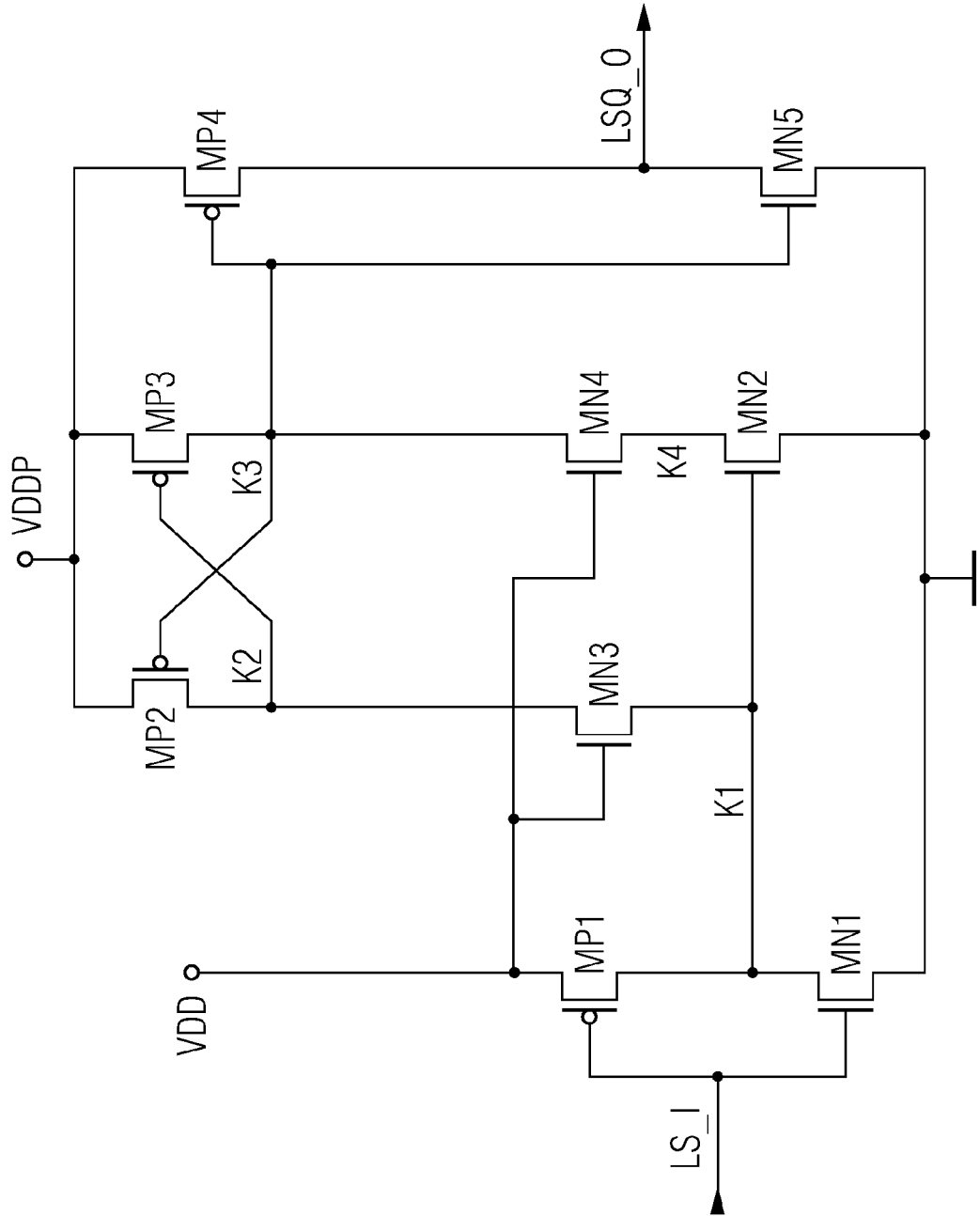

LEVEL SHIFTING

BACKGROUND

In conventional output drivers, a core voltage data signal is typically converted to a relatively higher voltage signal. In addition to the data signal, various other control signals output from the core to provide for activation of the driver or to bring the driver to a power down mode or high-impedance tri-state mode. These control signals are often converted from the lower core voltage to the higher voltage using a level shifter. For the conversion in the level shifter to take place correctly, it is assumed that the core voltage is present before, or at least not later than, the higher voltage.

However, if the core voltage is produced from the higher voltage using a voltage regulator, then the core voltage would not be present before the higher voltage during the engaging/switching-on of the supply voltage. In such a case, while the driver is connected to the supply voltage, the control signals would be at an undefined level, because the level shifter has not yet received an input signal and the core has not yet received the supply voltage. When engaging/switching-on the supply voltage in such a case, the output driver may not be safely brought to the power down or tri-state condition. This, in turn, may produce undesirable high cross currents in the output driver.

SUMMARY

Various aspects are described herein. For example, a method and apparatus may be provided for operating a level shifter. The level shifter may be coupled to a first supply voltage and a second supply voltage different from the first supply voltage. The method may include, for instance, detecting whether the first supply voltage is present, and decoupling an input of the level shifter from an output of the level shifter responsive to detecting that the first supply voltage is not present.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein:

FIG. 2 is a schematic block diagram of a circuit according to a further illustrative embodiment.

FIG. 4 is a circuit diagram of a level shifter according to an illustrative embodiment.

Figure 1:
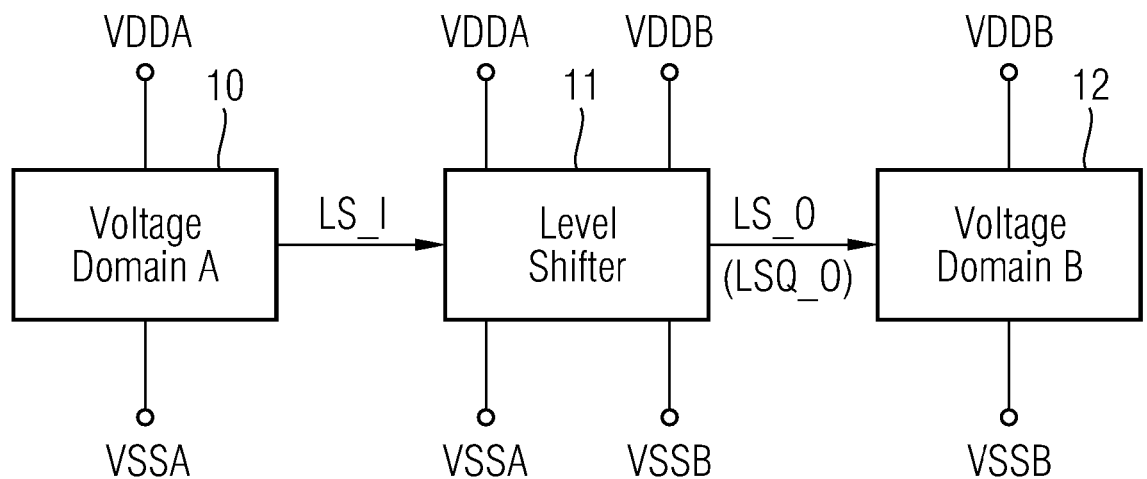
FIG. 1 is a schematic block diagram of a circuit according to an illustrative embodiment.

It is noted that the various drawings are not necessarily to scale.

DETAILED DESCRIPTION

The various aspects summarized previously may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled" or "connected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements. Furthermore, it should be appreciated that functional blocks or units shown in the drawings may be implemented as separate circuits in some embodiments, but may also be fully or partially implemented in a common circuit in other embodiments.

It is to be understood that the features of the various exemplary embodiments described herein may be combined with each other unless specifically noted otherwise.

In the following, various illustrative embodiments of level shifters for performing level shifting, and circuits comprising one or more of such level shifters, will be explained in detail. A level shifter, in this respect, may generally relate to a device that transforms a signal having a first voltage range to a signal having a second voltage range different from the first voltage range. Various embodiments described herein may potentially allow a level shifter to produce a defined output signal so that the driver may be switched with reduced cross current, or even without any cross current, during the engaging/switching-on of the supply voltage.

This concept will be further illustrated with reference to FIG. 1, showing a schematic block diagram of a circuit according to an illustrative embodiment.

The circuit shown in FIG. 1 shows a voltage domain A 10 connected to a first positive supply voltage VDDA and a first negative supply voltage VSSA. Voltage domain A 10 may be any kind of electronic circuit, for example a logic circuit or a memory circuit, the components of which are supplied by VDDA and VSSA.

Voltage domain A 10 outputs a signal labeled LS_I in FIG. 1. This signal in the embodiment shown has a voltage range determined by VDDA and VSSA, for example VDDA corresponding to a logic one (or "high") and VSSA corresponding to a logic zero (or "low"). However, in other embodiments the voltage range of LS_I may depend on VDDA and VSSA in any other manner, for example be a range from 0.5 VDDA to 0.5 VSSA.

The circuit shown in FIG. 1 further comprises a voltage domain B 12 which is supplied by a second positive supply voltage VDDB and a second negative supply voltage VSSB. Similar to voltage domain A 10, voltage domain B 12 may comprise any kind of electronic circuits like logic circuits, driver circuits, memory circuits and the like.

Voltage domain B 12 comprises an input for receiving an input signal labeled LS_O in FIG. 1. To be processed correctly by voltage domain B12, in this embodiment signal LS_O may be a signal adapted to the supply voltages VDDB, VSSB or voltage domain B12, for example a signal where a logic one is represented by a voltage of VDDB and a logic zero is represented by a voltage of VSSB.

In the embodiment shown, the first supply voltages VDDA, VSSA differ from the second supply voltages VDDB, VSSB. It should be noted that this does not imply that VDDA≠VDDB and VSSA≠VSSB. While in some embodiments this may be the case, in other embodiments other combinations are possible, such as VDDA≠VDDB and VSSA=VSSB. In such an embodiment, VSSA and VSSB may be at, for example, ground potential. In yet other embodiments, for example, VDDA may be equal to VDDB, and VSSA may be unequal to VSSB.

In various embodiments, the voltage range of signal LS_I may not correspond to the voltage range of signal LS_O. Therefore, in order for the voltage domain A 10 and voltage domain B 12 to be able to communicate with each other, in the embodiment shown a level shifter 11 is provided that shifts the voltage range of signal LS_I to the voltage range of voltage domain B 12 such that the signal LS_O generated by level shifter 11 (based on signal LS_I) may be processed by voltage domain B 12. In the embodiment shown, level shifter 11 is connected both to the first supply voltages VDDA, VSSA and to the second supply voltages VDDB, VSSB.

It should be noted that in the embodiments of FIG. 1, for clarity's sake a single connection between voltage domain A 10 and voltage domain B 12 including level shifter 11 is shown. In other embodiments, more than one such connection may be present. In addition to connections for transmitting signals from voltage domain A 10 to voltage domain B 12, connections may be present for transmitting signals in the reverse direction (i.e. from voltage domain B 12 to voltage domain A 10), including corresponding level shifters. Furthermore, in some embodiments voltage domain A 10 and/or voltage domain B 12 may include further connections to other devices, circuits, voltage domains and the like.

Generally, within the present description, LS_I designates an input signal of a level shifter, while LS_O designates a non-inverted output signal. In other words, for instance, a logical one of the input signal LS_I may cause a logical one of the output signal LS_O to be produced, and a logical zero of the input signal LS_I may cause a logical zero of the output signal LS_O to be produced. As indicated in brackets in FIG. 1, in other embodiments, level shifters may be provided that alternatively or additionally produce an inverted output signal designated LSQ_O. In this case, a logical one of LS_I may cause a logical zero of LSQ_O to be produced, and a logical zero of LS_I may cause a logical one of LSQ_O to be produced.

Before embodiments of level shifters that may be employed as, e.g., level shifter 11 in the circuit of FIG. 1 will be explained in more detail, a further illustrative embodiment of a circuit will be described with reference to FIG. 2. The circuit of the embodiment of FIG. 2 is implemented as a microchip or an integrated circuit, although in other embodiments similar circuits may be implemented with a plurality of microchips and/or circuitry external to one or more microchips. The circuit of FIG. 2 is supplied with a positive supply voltage VDDP via a connector 16 that corresponds to a pad voltage. Signals at the pads (external connections) of the circuit may be in a range between ground 18 and a positive supply voltage VDDP 16, wherein VDDP represents, e.g., a logical one and ground represents, e.g., a logical zero. VDDP may be, for example (depending on the microchip used) about 10 V, about 5 V, about 3.3 V, about 1.0 V, etc.

One such pad is designated with reference numeral 17 in FIG. 2 and serves to output a signal PADP. While only a single pad is depicted in FIG. 2, in other embodiments any number of pads, both for outputting signals and for inputting signals, may be present.

The circuit of FIG. 2 further includes a core circuit 19 that, for example, represents the internal logic of the above-mentioned microchip. Core circuit 19 operates at a supply voltage VDD, which in the embodiment shown is lower than VDDP. In some embodiments, VDD may be, for example, about 1.2 V or about 2.5 V. In other embodiments, other values are possible. The circuit elements of core circuit 19 are adapted to function with voltage VDD. For example, in various embodiments, gate length, gate thicknesses, and other parameters of metal-oxide-semiconductor (MOS) transistors of core circuit 19 may be adapted to VDD. In various embodiments, core circuit 19 may include one or more MOS transistors each having a minimal gate length, i.e. the shortest possible gate length realizable by the manufacturing processes used.

In the embodiment shown, VDD is derived from VDDP using a voltage regulator 15. In some embodiments, voltage regulator 15 may be implemented as a voltage divider, for example by using two or more resistors coupled between VDDP connector 16 and ground 18.

In the embodiment of FIG. 2, core circuit 19 outputs a data signal D corresponding to data or signals to be output on pad 17, and also outputs an enable signal ENQ. Both data signal D and enable signal ENQ in the embodiment of FIG. 2 have a voltage between VDD and ground, VDD representing logic one and ground representing logic zero. In other embodiments, other signals having voltages between VDD and ground may be output by core circuit 19.

Furthermore, the circuit of FIG. 2 includes a first level shifter 20 and a second level shifter 21. First level shifter 20 receives the enable signal ENQ and transforms it to a level shifted enable signal ENQ_LS, which is a signal corresponding to enable signal ENQ (inverted or not inverted) but transformed to a voltage range between VDDP and ground. In a similar manner, second level shifter 21 receives data signal D and transforms it to a level shifted data signal D_LS corresponding to data signal D (inverted or not inverted) but with a voltage range between VDDP and ground. In the embodiment shown, first level shifter 20 and second level shifter 21 are supplied both with VDDP and with VDD.

The signals ENQ_LS and D_LS are fed to a driver 22. The level shifted enable signal ENQ_LS enables or disables driver 22. For example, if ENQ_LS corresponds to a logic zero, driver 22 is disabled, for example put in a high impedance state (tri state), whereas when ENQ_LS corresponds to logic one (VDDP) driver 22 is enabled and outputs a signal depending on D_LS as signal PADP.

It should be noted that in other embodiments, driver 22 may be enabled when ENQ_LS is logic zero and disabled when ENQ_LS is logic one.

Compared with the embodiment of FIG. 1, in the embodiment of FIG. 2 core circuit 19 would correspond to voltage domain A 10 of FIG. 1, whereas driver 22, possibly with additional circuitry attached to pad 17, would correspond to voltage domain B 12 of FIG. 1.

The following paragraphs discuss various illustrative embodiments of level shifters that may be employed in the embodiments of FIGS. 1 and 2, and that also may be employed in other circuits where it is desirable to convert a signal from a first voltage range to a second voltage range.

Figure 3:
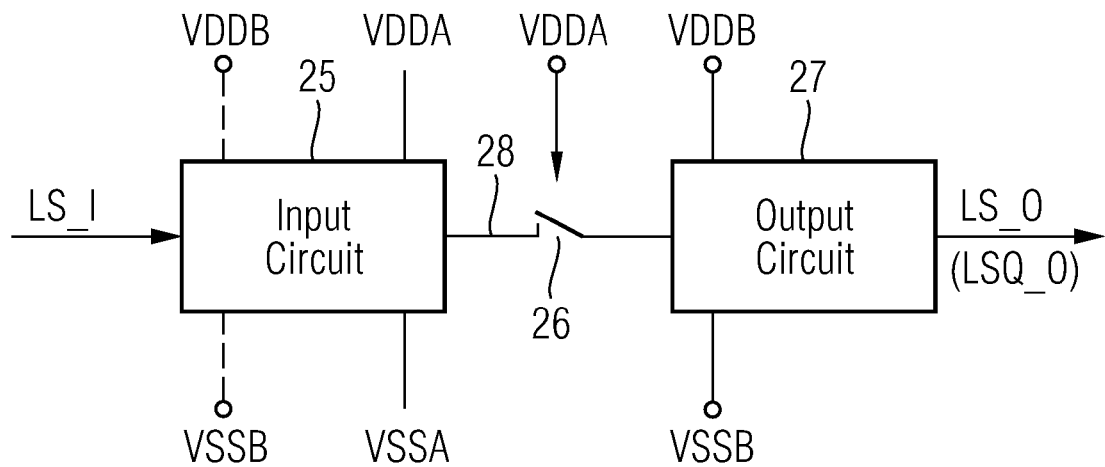
FIG. 3 is a schematic block diagram of a level shifter according to an illustrative embodiment.

In this respect, in FIG. 3 an embodiment of a level shifter is shown. The level shifter according to the embodiment of FIG. 3 comprises an input circuit 25 receiving an input signal LS_I and an output circuit 27 outputting a corresponding output signal LS_O. Input circuit 25 is supplied with first supply voltages VDDA, VSSA and optionally (as indicated by dashed lines) also with second supply voltages VDDB, VSSB. In an implementation of the level shifter of FIG. 3 as level shifter 20 and/or 21 in the embodiment of FIG. 2, as already mentioned VDDA may correspond to VDD, VDDB may correspond to VDDP and VSSA, VSSB may correspond to ground.

Output circuit 27 is supplied by second supply voltages VDDB, VSSB to output signal LS_O with a voltage range based on VDDB and VSSB. As already indicated with reference to FIG. 1, in addition or alternatively to the non-inverted output signal LS_O, an inverted output signal LSQ_O may be generated.

As shown, input circuit 25 and output circuit 27 are connected via a connection 28 comprising a switch 26. In the embodiment shown, switch 26 is controlled by VDDA such that when VDDA is present, i.e. asserted, switch 26 is closed corresponding to a normal mode of operation. When VDDA is not present, switch 26 is opened, disconnecting input circuit 25 from output circuit 27. A case where VDDA is not present may occur, for example, at startup in a circuit like the one shown in FIG. 2. In the circuit of FIG. 2, VDD (corresponding to VDDA) is derived from VDDP (corresponding to VDDB). Therefore, at startup of the system first VDDP is present, and then after a short time voltage regulator 15 needs to build up VDD, VDD is also present. However, during this short time, VDD is not present. In other words, VDD has not yet reached its nominal value. This situation may generally occur when VDDA is derived from VDDB. On the other hand, if VDDA is supplied by its own power supply, a failure of this power supply or any interconnecting elements may cause VDDA not to be present.

As already mentioned, the normal state of operation is for VDDA to be present, and in this case input circuit 25 and output circuit 27 act together to level shift input signal LS_I to output signal LS_O. If VDDA is not present and switch 26 is opened, output signal LS_O is not influenced by VDDA or LS_I. This is because output circuit 27 may be supplied only with the second supply voltage VDDB, VSSB. In an embodiment, this causes the output signal LS_O to assume a defined state, or, in other words, to cause output circuit 27 to be driven to said defined state by VDDB, VSSB.

Switch 26 may include one or more transistors, for example, used for switching. It should be noted that while connection 28 is drawn as a single line in FIG. 3, connection 28 may include one or more parallel lines connecting input circuit 25 with output circuit 27, and switch 26 correspondingly may include one or more sub-switches assigned to the individual lines.

The level shifter according to the embodiment of FIG. 3 may be used as level shifter 11 in the embodiment of FIG. 1 or as level shifter 20 and/or 21 in the embodiment of FIG. 2. Where the level shifter of FIG. 3 is used as level shifter 20 of FIG. 2, for example, the above-mentioned defined output state of output signal LS_O corresponding to ENQ_LS of FIG. 2 may be taken as a signal disabling driver 22. During start up, when VDD has not yet reached its nominal value, driver 22 may be disabled and may be enabled only after VDD has been asserted. If used as level shifter 11 of FIG. 1, the above-mentioned defined state of LS_O may indicate a failure of VDDA to voltage domain B 12, which then may react as appropriate, for example by halting the system and/or informing a user of the failure or the like.

A further illustrative embodiment of a level shifter will next be described with reference to FIG. 4. The embodiment of FIG. 4 may be, for example, used as a level shifter in the circuit of FIG. 2 where a lower supply voltage VDD and a higher supply voltage VDDP with respect to a common ground are used. However, the use of the level shifter of FIG. 4 as well as of the level shifters of FIGS. 5-12 (which will be described later) is not limited to circuits like the one shown in FIG. 2, and may be used generally in situations where a signal is to be level shifted.

The embodiment of FIG. 4 includes positive channel MOS (PMOS) transistors MP1-MP4 and negative channel MOS (NMOS) transistors MN1-MN5. In some embodiments, MP1, MN1 and MN2 are transistors adapted to supply voltage VDD, whereas the remaining transistors are adapted to work with supply voltage VDDP. In the circuit of FIG. 2, transistors MP1, MN1 and MN2 may therefore be considered "core devices," i.e. designed similar to transistors used in core circuit 19 regarding, for example, their gate lengths and/or oxide thicknesses. The remaining transistors in this case may be so considered analog transistors having a thicker gate oxide and therefore may be suitable for higher voltages such as VDDP.

In general, transistors are described herein as having two load terminals and a control terminal. In the case of field-effect transistors such as MOS transistors, a source and a drain correspond to the two load terminals, while a gate terminal corresponds to the control terminal. In the case of bipolar transistors, e.g., npn- or pnp-transistors, an emitter and a collector correspond to the load terminals, while a base corresponds to the control terminal.

In the illustrative embodiment of FIG. 4, input signal LS_I is fed to an inverter formed by PMOS transistor MP1 and NMOS transistor MN1, such that the inverted input signal is present at a node K1. Node K1 is coupled with a gate of NMOS transistor MN2. Compared with the embodiment of FIG. 3, transistor MP1, MN1 and MN2 form an input circuit of the level shifter of FIG. 4.

Node K1 is coupled to a node K2 via NMOS transistor MN3, whereas a node K4 is coupled to a load terminal of NMOS MN2 and also coupled to a node K3 via NMOS transistor MN4. The gates of transistors MN3 and MN4 are coupled to supply voltage VDD. NMOS transistors MN3 and MN4 may be designed such that they are conducting between their source and drain terminals, i.e. their load terminals, when VDD is present or has at least approximately reached its nominal value, for example 90% of its nominal value. On the other hand, if VDD is not present, for example at the beginning of startup of a circuit like the one shown in FIG. 2 where VDD is derived from VDDP, NMOS transistors MN3 and MN4 may exhibit a blocking behavior, i.e. have a high impedance between their load terminals.

Therefore, NMOS transistors MN3 and MN4 may act as switch that, in response to VDD not being present, decouples transistors MP1, MN1, MN2 from the circuit portion formed by transistors MP2, MP3, MP4 and MN5. In other words, NMOS transistors MN3 and MN4 correspond to switch 26 of FIG. 3, and transistors MP2, MP3, MP4 and MN5 correspond to output circuit 27 of FIG. 3.

When VDD is present and transistors MN3 and MN4 provide low impedance between their load terminals, this corresponds to the normal operating state of the level shifter according to the embodiment of FIG. 4, which will be described below.

In this normal state, node K1 is connected with node K2, while a load terminal of transistor MN4 is connected with node K3. As shown in FIG. 4, the gate terminals of transistors MP2 and MP3 and a load terminal of transistor MP3 and MP2 are connected with nodes K3 and K2, respectively, while the respective other load terminals of transistors MP2 and MP3 are connected with VDDP. In other words, PMOS transistors MP2 and MP3 are a pair of cross coupled transistors forming a bi-stable circuit portion, with node K2 being an inverting output and node K3 being a non-inverting output. Depending on the state of the input signal LS_I, one of nodes K2 and K3 assumes a logical one corresponding to VDDP, while the respective other node of K2 and K3 assumes a logical zero corresponding to ground. In particular, if input signal LS_I corresponds to VDD, node K3 is loaded to VDDP. If LS_I corresponds to ground, node K3 is drawn to ground.

Node K3 is coupled with an input of an output inverter formed by PMOS MP4 and NMOS MN5, wherein the output inverter formed by transistors MP4 and MN5 is coupled between VDDP and ground. Therefore, the inverted state of node K3 is output as output signal LSQ_O, wherein VDDP corresponds to a logical one and ground corresponds to a logical zero.

In summary, when VDD is present, the circuit of FIG. 4 may act as an inverting level shifter, wherein LS_I at a logical one (or high; corresponding to VDD) leads to LSQ_O being at a logical zero (or low; corresponding to ground), and LS_I at a logical zero (corresponding to ground) leads to LSQ_O being at a logic one (or high; corresponding to VDDP).

In other illustrative embodiments, as will be explained later, a non-inverting level shifter may be provided by connecting node K2, instead of node K3, with the output inverter formed by transistors MP4 and MN5 or by providing an additional inverter.

Next, the operation of the circuit of FIG. 4 in a startup phase when VDD is not yet asserted will be described. Such a situation, as already explained, may occur when, as in the embodiment of FIG. 2, VDD is derived from VDDP. At startup, VDDP may be present first, and after a certain time, for example after a time delay in the rage of about one microsecond to about one millisecond, VDD may be asserted.

As already explained, when VDD is not present, NMOS transistors MN3 and MN4 may exhibit high impedance, effectively decoupling the circuit portion formed by MP1, MN1 and MN2 from the rest of the level shifter of the embodiment of FIG. 4. In this case, nodes K2 and K3 may be loaded to VDDP via PMOS transistors MP2 and MP3, respectively. Since node K3 is connected with the sum of gate-source-capacitances of MP2 and MP4, the gate-source-capacitance of MP4 additionally supports the loading of K3 to VDDP. Therefore, K3 may be loaded to VDDP faster than K2.

In this respect, it should be noted that a leakage current potentially causing an unloading of nodes K3 and K2 may be governed by two blocking NMOS transistors MN4 and MN2 in the case of node K3. Alternatively, node K2 may be connected via a single blocking NMOS transistor MN3 with node K1. Node K1, on the other hand, in case of VDD not being present has two possible unloading paths to ground, one via MN1 and one via MP1 (since VDD is equal to or approximately equal to zero in this case). Therefore, in the embodiment shown, node K2 is subjected to a stronger unloading than node K3. This further contributes to the fact that K3 is loaded to VDDP corresponding to logic one. Correspondingly, in this case through the output inverter formed by MP4 and MN5 a logic zero corresponding to ground is output.

In summary, in the illustrative embodiment of FIG. 4, when VDD is not present, a logical zero (i.e. a defined state), is output by the level shifter.

It should be noted that for circuits like the one shown in FIG. 2, VDD may be present after a delay, such as in the range of about one microsecond to about one millisecond. In such circuits, it may be sufficient that the defined state be held only for such a comparatively short period of time.

In some embodiments, the channel width of MP3 may be dimensioned wider than a corresponding width of MP2. In such embodiments, the loading current from VDDP via MP3 to K3 may be greater than the loading current from VDDP via MP2 to K2, which further supports K3 being loaded to VDDP.

Figure 5:
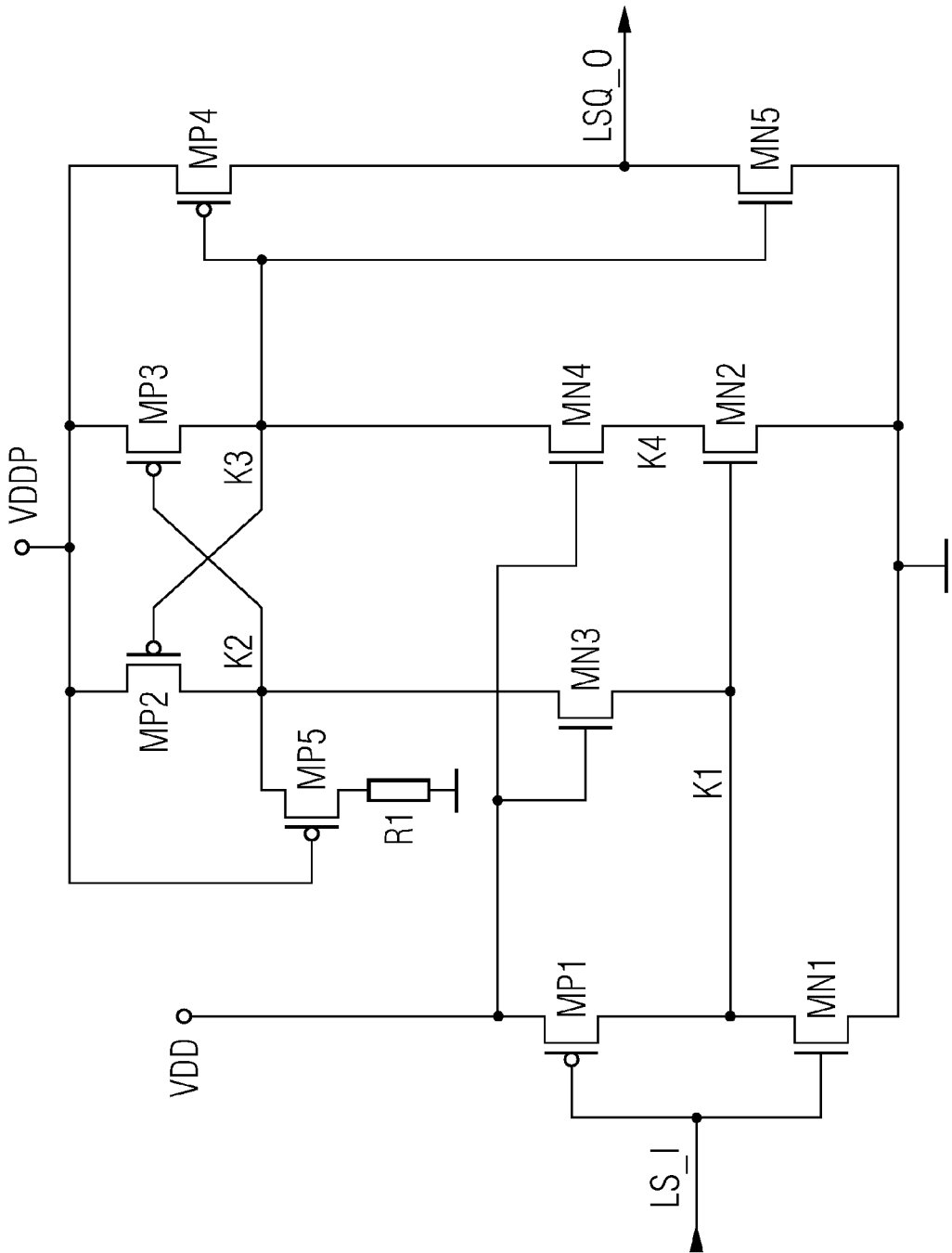
FIG. 5 is a circuit diagram of a level shifter according to a further illustrative embodiment.

A further illustrative embodiment of a level shifter is shown in FIG. 5. The embodiment of FIG. 5 is based on the embodiment of FIG. 4. Compared with the embodiment of FIG. 4, an additional PMOS transistor MP5 and a resistor R1 has been added. In some embodiments, MP5 may be a transistor with minimal dimensions as allowed by a corresponding manufacturing process, and resistor R1 has a value in the range of 1 kOhm to 100 kOhm. In other embodiments, other transistor configurations and/or other resistance values may be used. Since apart from these elements, the elements of the embodiment of FIG. 5 and their functions are the same as previously described with respect to FIG. 4, in the following only the additional elements and their functions will be described.

In the embodiment of FIG. 5, a first load terminal of PMOS transistor MP5 is connected with node K2, and a second load terminal is connected via resistor R1 to ground. A gate of transistor MP5 is connected to VDDP.

During normal operation of the level shifter according to the embodiment of FIG. 5, VDDP is present and thus transistor MP5 is highly resistive. Therefore, the circuit basically operates as if transistor MP5 and R1 were not present, i.e. as the circuit of FIG. 4.

When the circuit of FIG. 5 is switched off, according to some embodiments, VDDP drops to zero. In this case, transistor MP5 becomes more conductive, and node K2 is unloaded to ground via transistor MP5 and resistor R1.

When the circuit then is switched on again, K2 is in an unloaded state, i.e. a potential of or near ground, such that transistor MP3 is conductive for loading node K3.

Figure 6:
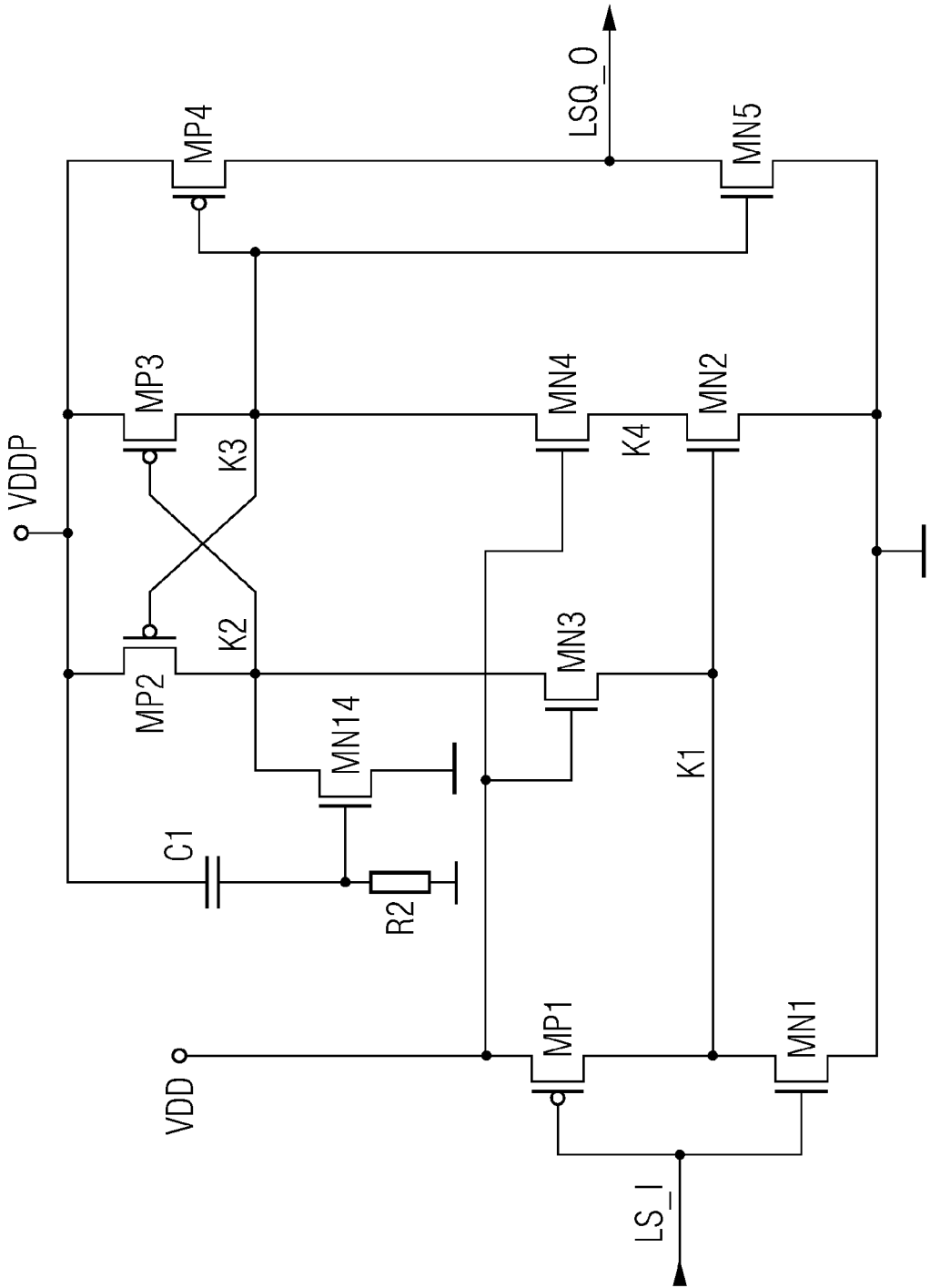
FIG. 6 is a circuit diagram of a level shifter according to a further illustrative embodiment.

FIG. 6 shows a further illustrative embodiment of a level shifter. This embodiment, similar to the embodiment of FIG. 5, is based on the embodiment of FIG. 4, and the parts and components already described with reference to FIG. 4 will not be described again in the following. FIG. 6 shows an alternative to the path for unloading node K2, including transistor MP5 and resistor R1 previously discussed with reference to FIG. 5. In the embodiment of FIG. 6, node K2 is coupled to ground via an NMOS transistor MN14. A gate of NMOS transistor MN14 is coupled with ground via resistor R2 and coupled with VDDP via capacitance C1.

After VDDP is turned on at startup and during the rise of VDDP, capacitance C1 becomes conducting, thereby coupling the gate of NMOS transistor MN14 with VDDP and therefore switching transistor MN14 on. When NMOS transistor MN14 is switched on, K2 is unloaded, i.e. drawn to ground, via transistor MN14. When VDDP after the switching on has reached its final value and remains substantially constant, capacitance C1 effectively decouples the gate of NMOS transistor MN14 from VDDP, and the gate of NMOS transistor MN14 is drawn to ground via resistor R2. Therefore, NMOS transistor MN14 is switched to a blocking, or non-conducting, state, which decouples node K2 from ground such that the circuit portion including capacitance C1, resistor R2 and NMOS transistor MN14 effectively does not influence the functioning of level shifter during normal operation. In some embodiments, values for R2 and C1 are chosen such that transistor NM14 at startup is conducting for a period of time, such as about 10-100 ns. In such embodiments, R2 may have a resistance in the range of about 10 kOhm to about 1 MOhm, and C1 may have a capacitance in the range of about 100 fF to about 1 pF. In other embodiments, other values may be chosen.

Comparing the embodiment of FIG. 6 with the embodiment of FIG. 5, in the embodiment of FIG. 5 node K2 is unloaded when VDDP is switched off, while according to the embodiment of FIG. 6 node K2 is unloaded when VDDP is switched on. In yet other embodiments, both possibilities with their respective circuit portions may be provided, i.e. a combination of the embodiments of FIGS. 5 and 6.

Figure 7:
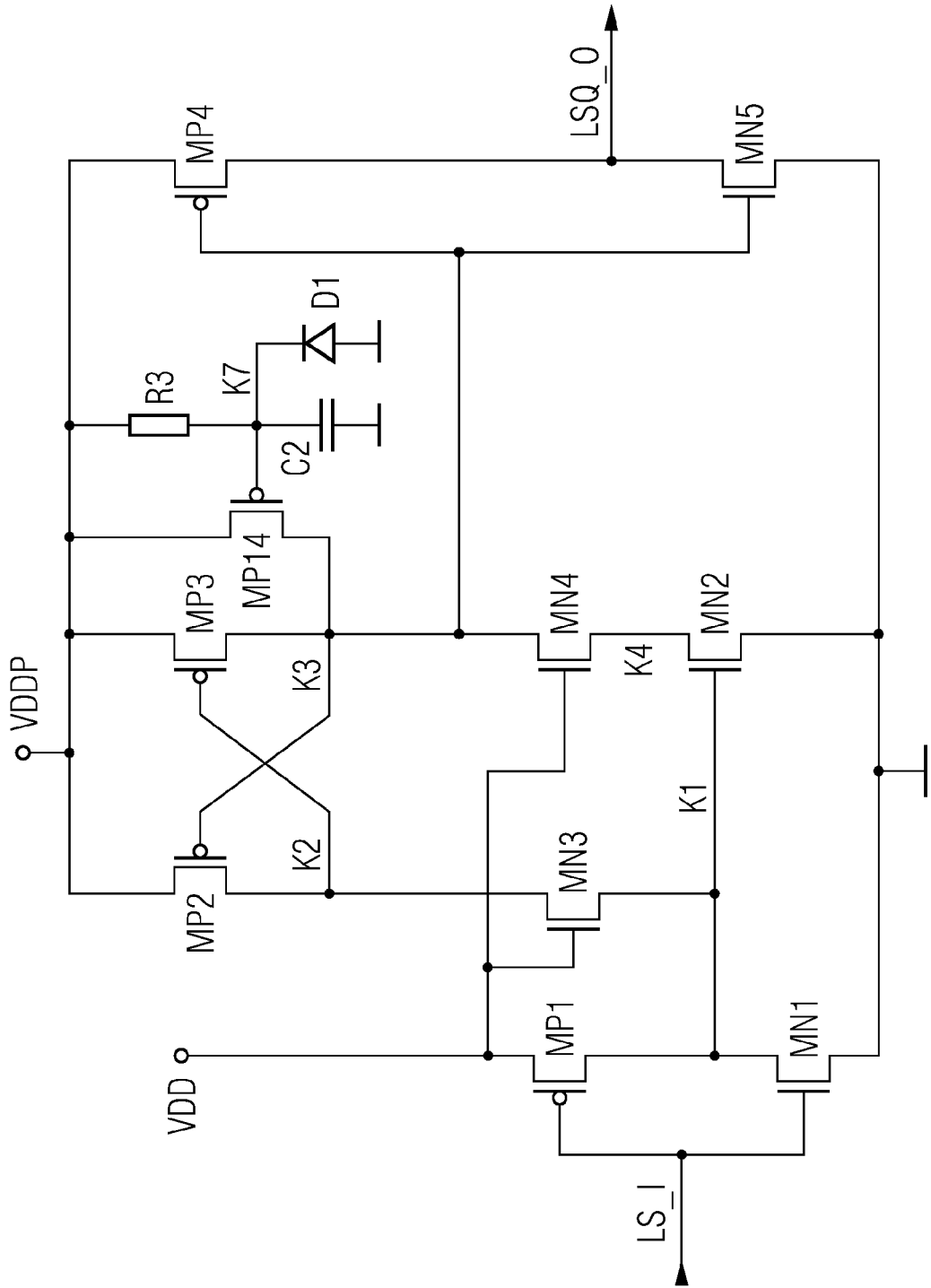
FIG. 7 is a circuit diagram of a level shifter according to another illustrative embodiment.

In the embodiments of FIGS. 5 and 6, node K2 is unloaded or drawn to ground when VDDP is switched off and on, respectively. Next, with reference to FIG. 7, a further illustrative embodiment will be discussed where node K3 is drawn to VDDP by an additional pre-charging mechanism when VDDP is switched on, for example at the startup of the circuit. The embodiment of FIG. 7 again is based on the embodiment of FIG. 4, and those parts and elements already described with reference to FIG. 4 will not be described again. In the embodiment of FIG. 7, node K3 is connected via a PMOS transistor MP14 with VDDP as shown in FIG. 7. A gate of PMOS transistor MP14 is connected with a node K7. Node K7 is connected with VDDP via a resistor R3 and with ground via a capacitance C2 and a diode D1. When the circuit is switched off, i.e. if VDDP is not present, node K7 unloads, or is drawn to ground, via a reversed current via diode D1. When VDDP is then switched on, node K7 is basically kept at or near ground level because capacitance C2 (similar to capacitance C1 in the embodiment of FIG. 6) is conducting during the rise of VDDP to its final value. Therefore, while node K7 is at or near ground, transistor MP14 is conducting between its load terminals such that node K3 is drawn to VDDP, i.e. to logic one. When VDDP has reached its final value and remains constant, capacitance C2 decouples node K7 from ground, and node K7 is drawn to VDDP via resistor R3 switching PMOS MP14 off such that during normal operation, the circuit of FIG. 7 essentially operates like the circuit of FIG. 4. In some embodiments, R3 and C2 may have values as given above for R2 and C1, respectively, of the embodiment of FIG. 6, although in other embodiments other values may be chosen.

It should be noted that the embodiment of FIG. 7 may be combined with the embodiments of FIG. 5 and/or FIG. 6 such that both a pre-charging mechanism for node K3 and an unloading mechanism for node K2 is provided in such combined embodiments.

The embodiments of FIGS. 4-7 as already mentioned are inverting level shifters, i.e. an input signal LS_I corresponding to a logical one (or high) causes an output signal LSQ_O of logical zero (or low), and an input signal LS_I of a logical zero causes an output signal LSQ_O of a logical one. In the following discussion, with reference to the illustrative embodiments of FIGS. 8 and 9, both an inverted output signal LSQ_O and a non-inverted output signal LS_O are provided by a level shifter. The embodiments of FIGS. 8 and 9 are also based on the embodiment of FIG. 4, and elements already described with reference to FIG. 4 will not be described again.

Figure 8:
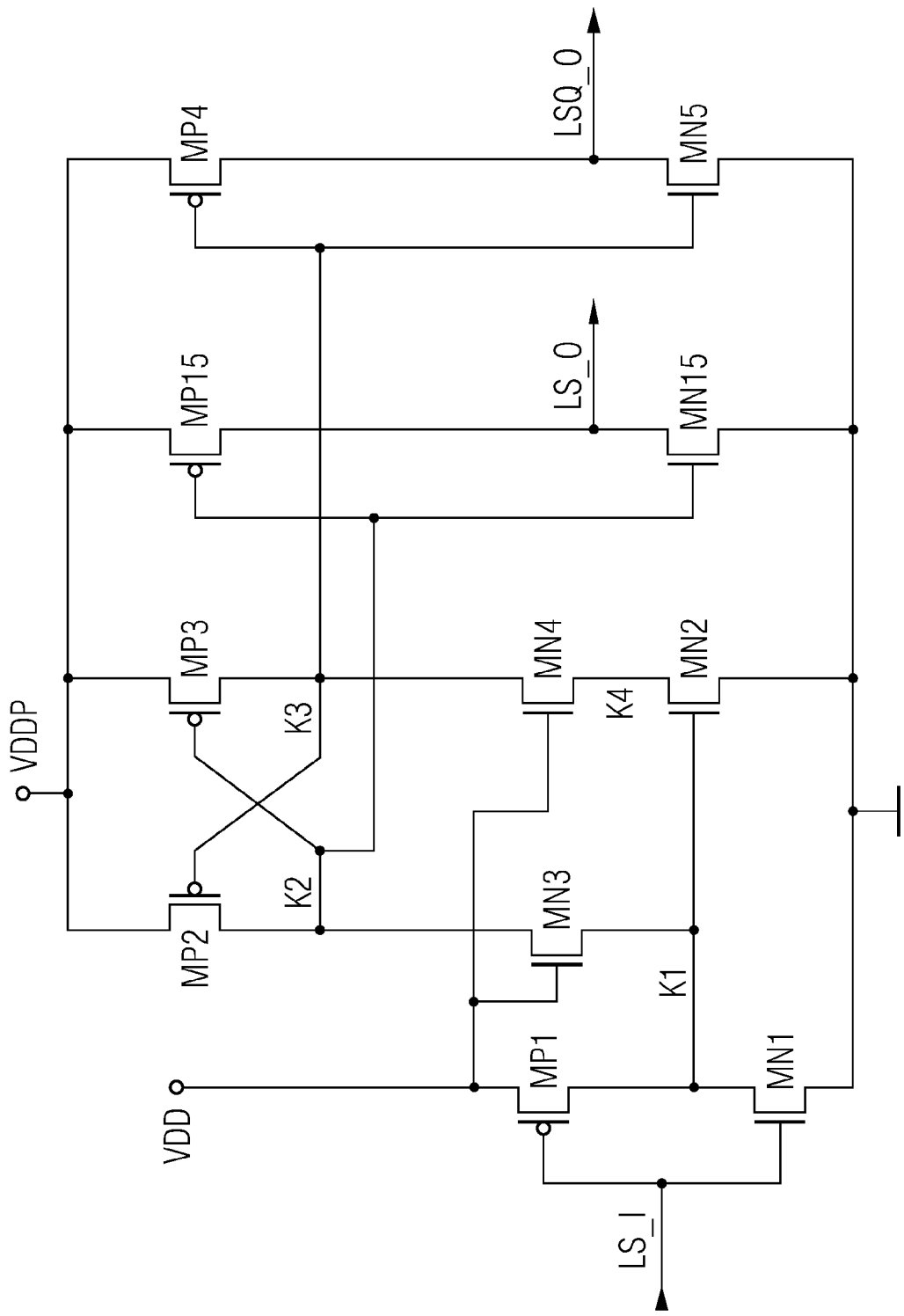
FIG. 8 is a circuit diagram of a level shifter according to still another illustrative embodiment.
Figure 9:
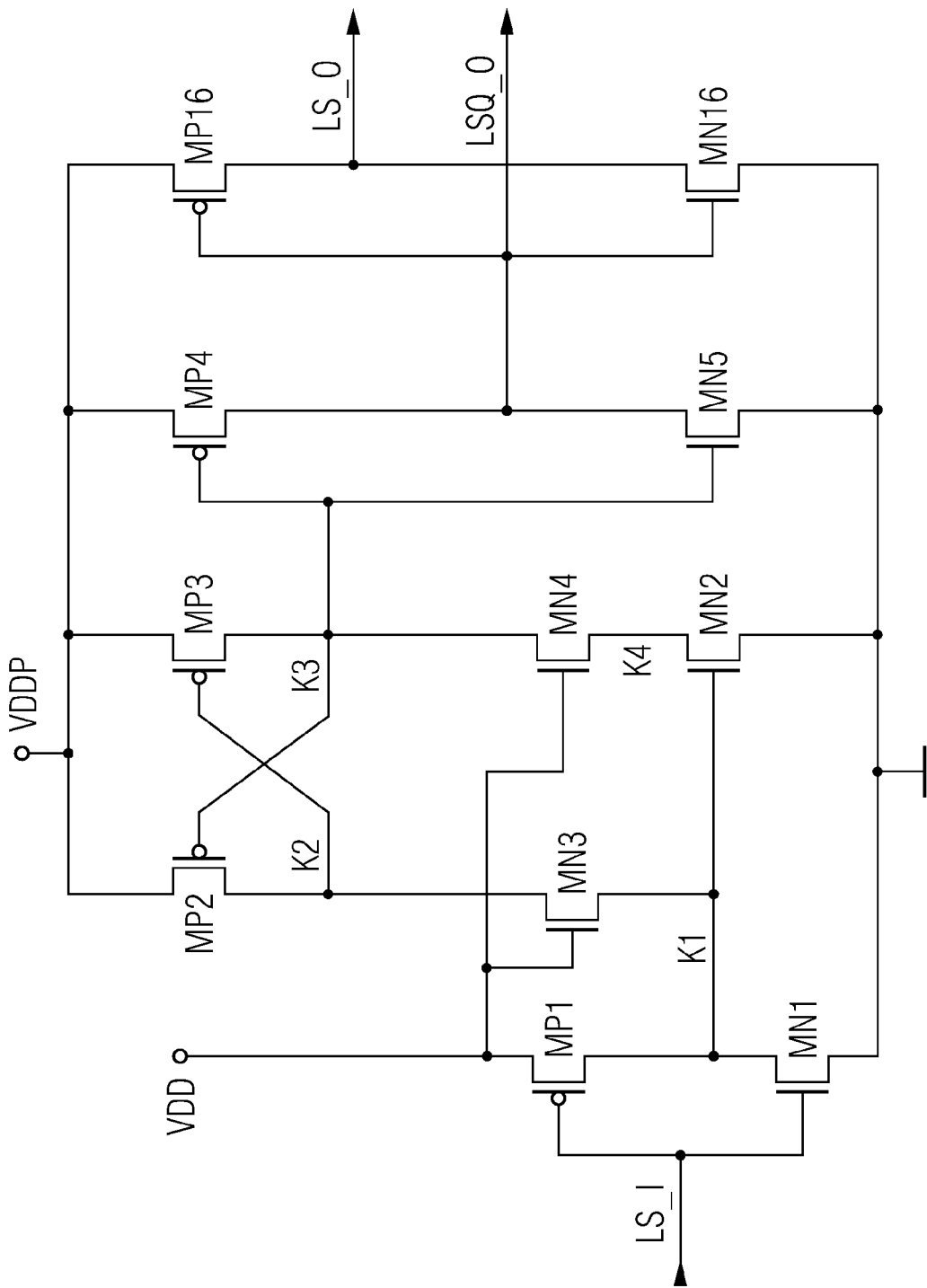
FIG. 9 is a circuit diagram of a level shifter according to a further illustrative embodiment.

In the embodiment of FIG. 8, the inverted output signal LSQ_O is output by an output inverter including transistors MP4 and MN5 like in the embodiment of FIG. 4. Additionally, in the embodiment of FIG. 8, a further output inverter including a PMOS transistor MP15 and an NMOS transistor MN15 is provided. The gates of transistors MP15 and MN15, i.e. the input of the further output inverter, is coupled with node K2 that, as previously explained, assumes the opposite state of node K3. Therefore, a non-inverted signal LS_O is obtained as an output signal from the further output inverter. Put another way, when LS_I is at a logical one, LS_O is also at a logical one, and when LS_I is at a logical zero, LS_O is also at a logical zero. It should be noted that if for a specific application only the non-inverted output signal LS_O is desired, in a corresponding embodiment the output inverter comprising transistors MP4 and MN5 may be omitted such that the level shifter according to such an embodiment only produces the non-inverted output signal LS_O.

In the embodiment of FIG. 9, again the inverted output signal LSQ_O is output by an output inverter formed by transistors MP4 and MN5, the gates of which are coupled to node K3. In addition to being output, the inverted output signal LSQ_O is supplied to an input of a further output inverter including a PMOS transistor MP16 and an NMOS transistor MN16, i.e. to the gates of transistors MP16 and MN16 as shown in FIG. 9. This further output inverter inverts the inverted output signal LSQ_O and therefore outputs a non-inverted output signal LS_O. In embodiments where the inverted output signal LSQ_O is not desired, the corresponding output of FIG. 9 may be omitted and only the non-inverted output signal LS_O may be output.

It should be noted that while the embodiments of FIGS. 8 and 9 have been based on the embodiment of FIG. 4, the additional features for unloading and pre-charging nodes K2 and K3, respectively, discussed with reference to FIGS. 5-7 may also be implemented in the embodiments of FIGS. 8 and 9.

Figure 10:
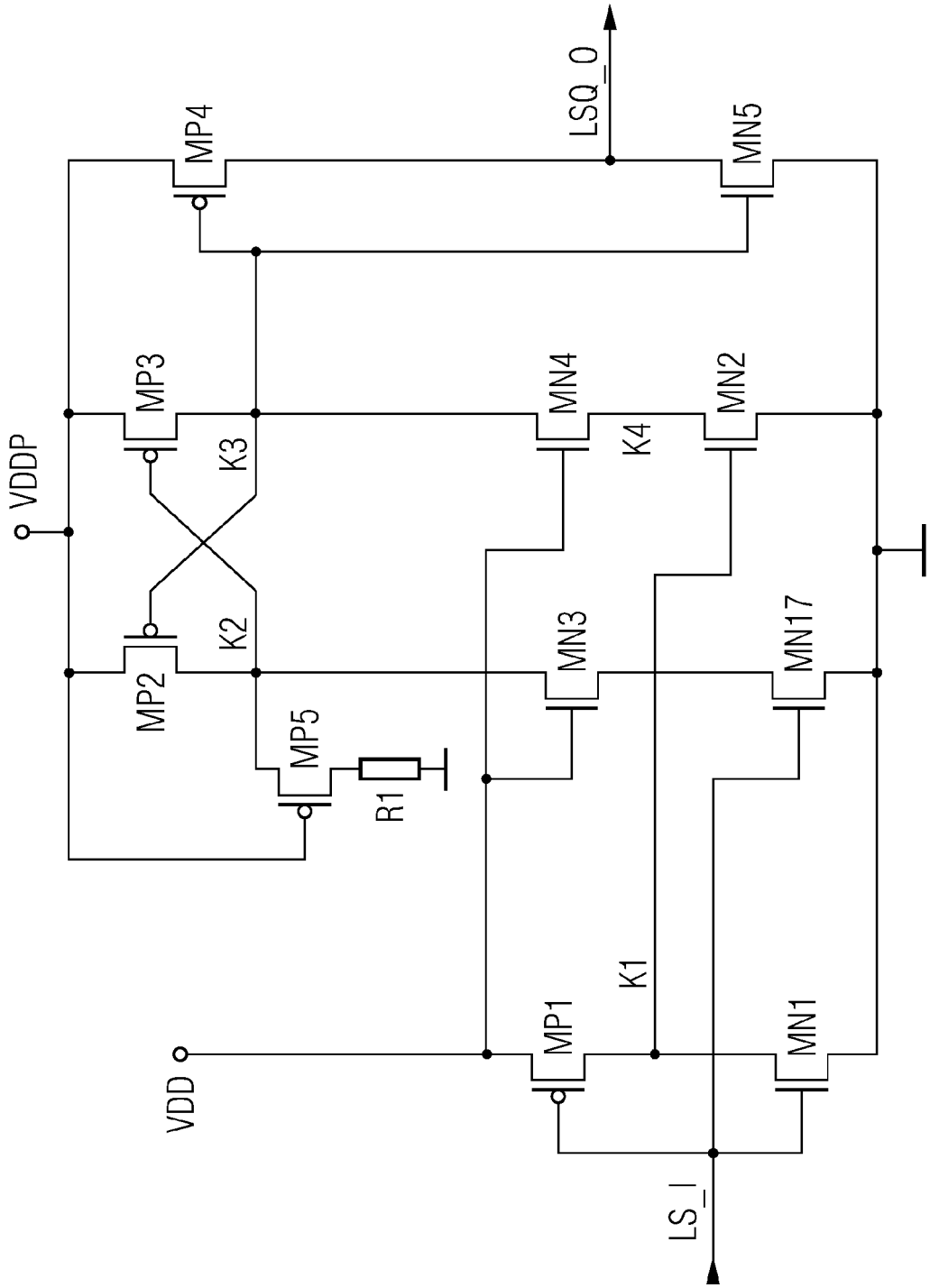
FIG. 10 is a circuit diagram of a level shifter according to yet another illustrative embodiment.

A further illustrative embodiment of a level shifter will be discussed with reference to FIG. 10. The embodiment of FIG. 10 is based on the embodiment of FIG. 5 including PMOS transistor MP5 and resistor R1 for unloading node K2 when VDDP is turned off. The features of the embodiment of FIG. 10 already described with reference to FIGS. 4 and 5 will not be described again.

In contrast to the previously discussed embodiments, the input circuit portion, i.e. the circuit elements between the input where input signal LS_I is supplied to the level shifter and transistors MN3, MN4, may be symmetric. In other words, while in the previously discussed embodiments a load terminal of transistor MN3 was coupled with node K1, while a load terminal of transistor MN4 was coupled to ground via transistor MN2, in the embodiment of FIG. 10 the corresponding load terminal of transistor MN3 is coupled to ground via a NMOS transistor MN17, and the corresponding load terminal of transistor MN4 is still coupled with ground via transistor MN2. As already discussed with respect to the previous embodiments, the gate of transistor MN2 is coupled with node K1. Furthermore, the gate of transistor MN17 is coupled with the input of the circuit, i.e., receives the non-inverted input signal LS_I (in contrast to the gate of MN2, which receives the inverted input signal). Therefore, in the embodiment of FIG. 10, during normal operation when transistors MN3 and MN4 are conducting, depending on the state of LS_I, one of transistors MN2, MN17 is conducting, while the other one of transistors MN2, MN17 is non-conducting, thus connecting one of nodes K2, K3 with ground.

Otherwise, the operation of the level shifter according to the embodiment of FIG. 10 essentially corresponds to the one previously discussed, in particular the operation of the output state and the behavior when VDD is not present, for example at startup. Also, while the embodiment of FIG. 10 includes the unloading path for node K2 as discussed with reference to FIG. 5, this unloading path may be omitted as in the embodiment of FIG. 4, and the unloading path of the embodiment of FIG. 6 and/or the pre-charging path of the embodiment of FIG. 7 may additionally or alternatively be present. Furthermore, while the inverter of the embodiment of FIG. 10 is inverting, in case a non-inverted output signal is desired, the output circuit portion of the level shifter of FIG. 10 may be implemented in another embodiment as discussed with respect to FIG. 8 or 9 with a further output inverter.

Figure 11:
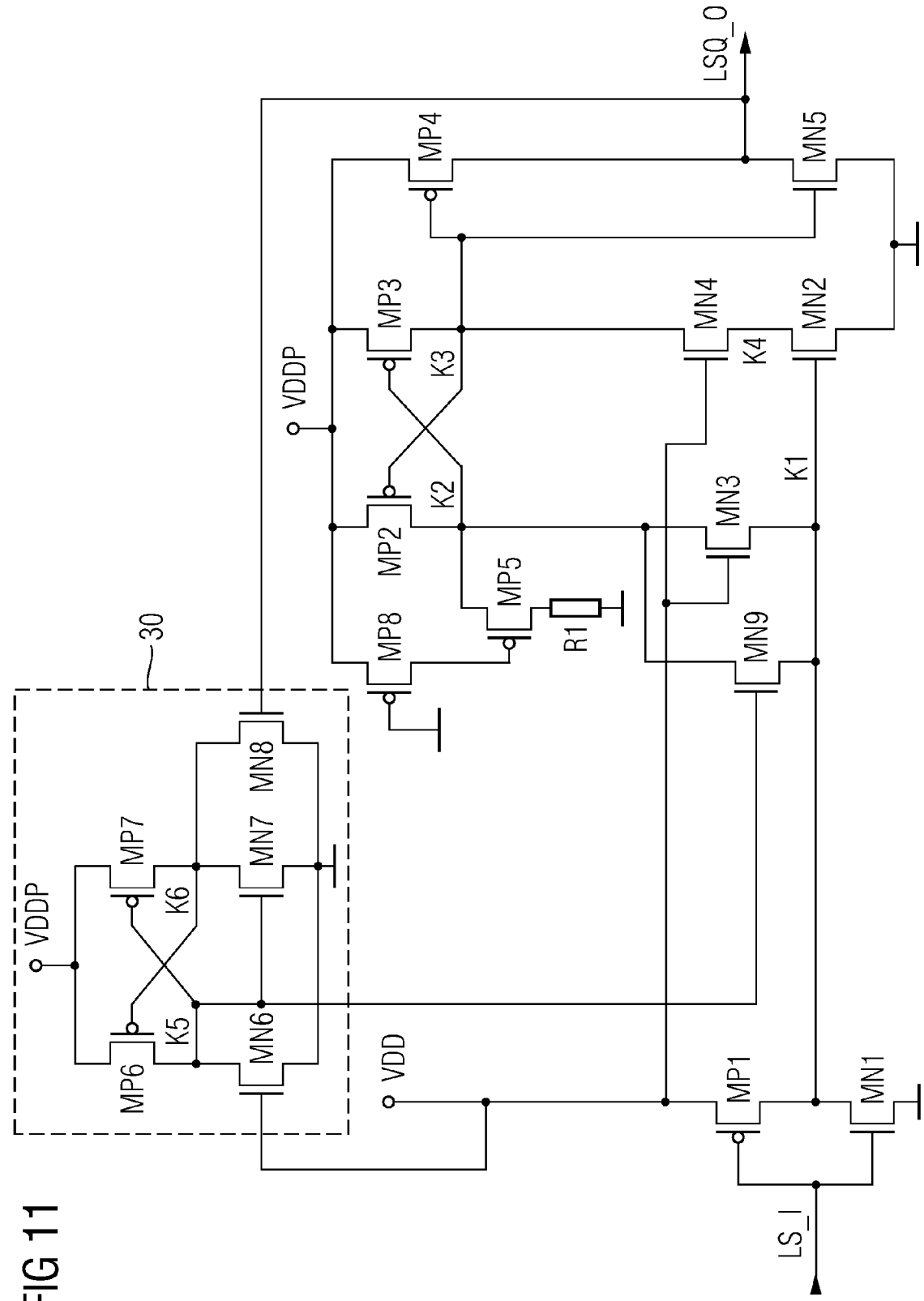
FIG. 11 is a circuit diagram of a level shifter according to another illustrative embodiment.

A further illustrative embodiment of a level shifter is shown in FIG. 11. The embodiment of FIG. 11 is based on the embodiment of FIG. 5, and again, like elements bear the same reference numerals. The elements of the embodiment of FIG. 11 already present in the embodiment of FIGS. 4 and 5 will not be described again.

Compared with FIG. 5, in the embodiment of FIG. 11 two changes have been made, which may be made independently from each other. In other words, one or both of these changes may be performed.

The first change is that a PMOS transistor MP8 has been added. A first load terminal of transistor MP8 is connected to VDDP, a second load terminal of transistor MP8 is connected with the gate of transistor MP5, and the gate of transistor MP8 is connected to ground. In other words, the direct connection between the gate of transistor MP5 and VDDP of FIG. 5 has been replaced by an indirect connection. Since the gate of PMOS MP8 is coupled to ground, PMOS MP8 is conducting between its load terminal and therefore generally does not influence the functionality of the circuit. With the addition of MP8, the gate of MP5 may allow for additional protection against electrostatic discharge (ESD) by not being directly connected to VDDP.

The second change mentioned above involves the addition of a comparator circuit 30 and an NMOS transistor MN9. Comparator circuit 30 includes cross-coupled PMOS transistors MP6 and MP7 connected with each other via nodes K5, K6 in a similar manner as MP2 and MP3 are connected via nodes K2 and K3, and NMOS transistors MN6-MN8. The gates of transistors MN6 and MN8 serve as input of the comparator circuit 30, while node K5 serves as output.

The level shifter of FIG. 11 is adapted to cases where VDD may drop to zero or not be present during operation of the circuit. In such a case, where for example VDD and VDDP have been present for some time, in normal operation the output of the level shifter may be a logical one, for example, according to an enable signal like signal ENQ in FIG. 2. Comparator circuit 30 at its input receives LSQ_O at the gate of NMOS MN8 and VDD at the gate of the gate of NMOS MN6. When LSQ_O is at a logical one, node K3 is at a logical zero, while node K2 is at a logical one. Therefore, MP3 is blocking while MP2 is conducting. In the event that VDD is not present for some reason, for example a failure, MN3 and MN4 become non-conducting as described above. This may preserve this state of nodes K2 and K3 in this case such that LSQ_O would remain at a logical one, which is a defined state. With the addition of circuit 30, as will be explained, LSQ_O changes to a logical zero, such that the circuit of FIG. 11 according to various embodiments may be used in cases where it is desirable that if VDD fails after some time of operation, LSQ_O assumes a value of a logical zero.

In the event that LSQ_O is at a logical one and VDD drops to zero, MN6 is blocking while MN8 is conducting. Since MN8 connects K6 and ground, K6 is drawn to ground (logical zero) such that PMOS MP6 becomes conducting and node K5 is loaded to VDDP so that MP7 exhibits a high impedance.

On the other hand, if VDD is present, MN6 is conducting, thereby drawing node K5 to ground.

When in case of the above-mentioned failure of VDD, node K5 is drawn to VDDP, NMOS transistor MN9 becomes conducting such that node K2 is unloaded and drawn to ground via transistor MN9 and PMOS MP1 (VDD in this case is not present, i.e. zero). When K2 is unloaded, the behavior as explained above for the embodiments of FIGS. 4 and 5 applies such that a logical zero is output at LSQ_O. Therefore, in the circuit of FIG. 11, if VDD is not present, a logic zero is always output regardless of whether VDD is present at startup for some time or during operation of the circuit.

It should be noted that instead of being based on the embodiment of FIG. 5, the embodiment of FIG. 11 may be based on the embodiment of FIG. 4. In other words, comparator circuit 30 and NMOS transistor MN9 may be used in the embodiment of FIG. 4 where transistors MP5 and MP8 and resistors R1 are not present. Furthermore, in other embodiments, other realizations of comparator circuit 30 may be used. In still other embodiments, an unloading path for nodes K2 may be provided via a PMOS transistor which is opened when VDD is not present. In yet other embodiments, a comparator circuit like comparator circuit 30 of FIG. 11 may be provided in the embodiments of FIGS. 6-10.

Furthermore, while the embodiments of FIGS. 4-11 show level shifters comprising an input inverter, an output inverter and cross coupled PMOS transistors, one of the principles explained with reference to the embodiment of FIG. 3, namely, decoupling an input circuit portion from an output circuit portion when one of the two supply voltages (VDDA in case of FIG. 3) is not present such that the output level is generated by the respective other supply voltage, may be used in other types of level shifters.

The level shifters according to the embodiments of FIGS. 3-11 may, as already mentioned, be employed in electronic circuits such as the circuit according to the embodiment of FIG. 1 as level shifter 11 or in the circuit according to the embodiment of FIG. 2 as level shifter 20 and/or level shifter 21. In other embodiments of circuits such as the circuit shown in FIG. 2, only level shifter 20 may be implemented based on embodiments like the one shown with reference to FIGS. 3-11, such that the level shifted enable signal ENQ_LS assumes a predetermined level when VDD is not present, for example at a startup. In such embodiments, driver 22 of FIG. 2 may be disabled during this period.

In such a case, level shifter 21, which may be used for level shifting data signal D in the embodiment of FIG. 2 also may be implemented according to one of the embodiments of FIGS. 3-11. On the other hand, since in such embodiments where level shifter 20 is for example a level shifter according to one of the embodiments of FIGS. 3-11, driver 22 is disabled as long as VDD is not present. The state of data signal D_LS may not be relevant during this period. Therefore, for level shifter 21, a level shifter may be used that does not "react" to VDD not being present in a way to produce a defined output. An example of such a level shifter that may be used as level shifter 21 in the circuit of FIG. 2 is shown in FIG. 12.

Figure 12:
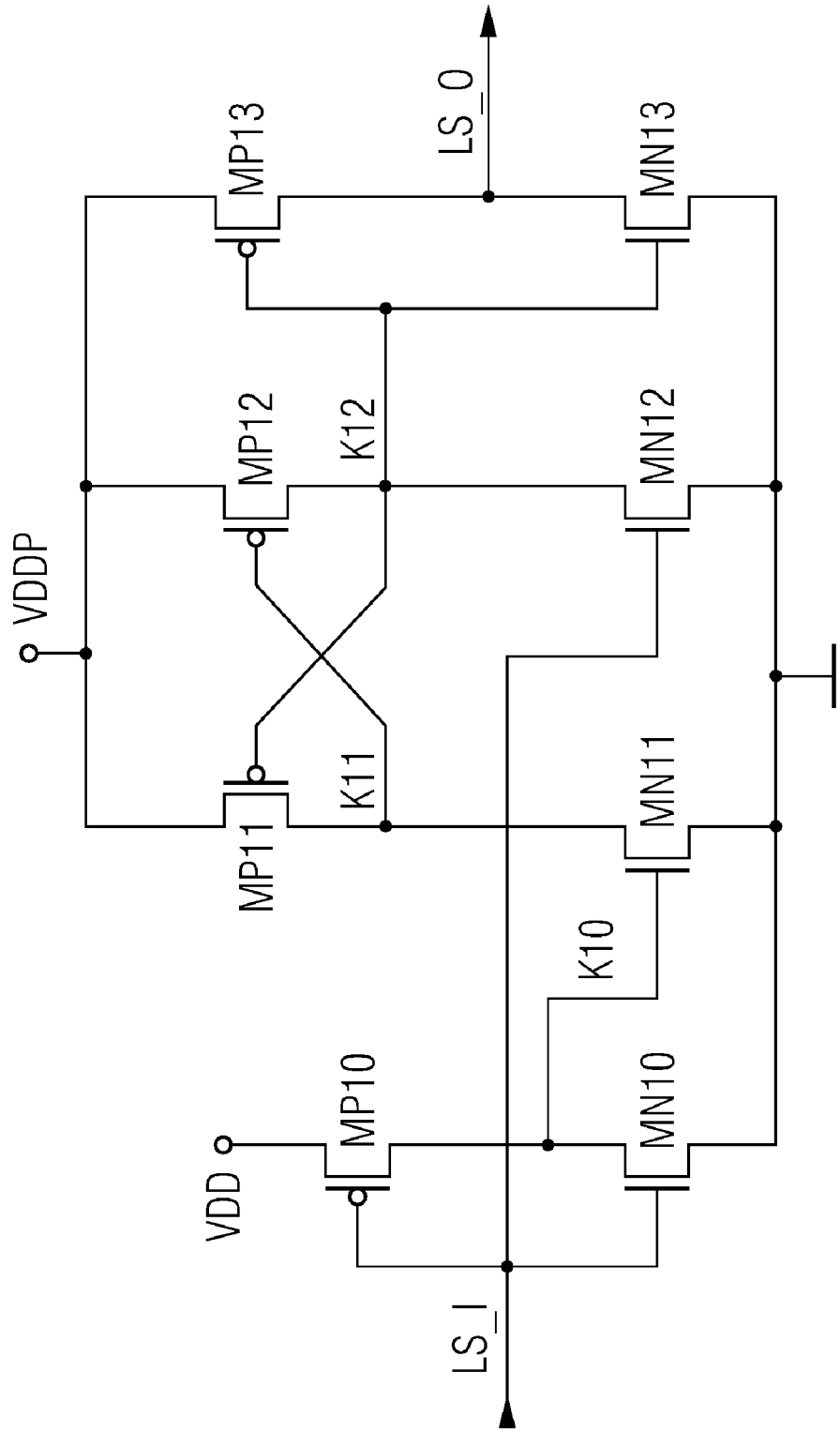
FIG. 12 is a circuit diagram of a level shifter employed in illustrative embodiments of circuits.

The level shifter of FIG. 12 includes PMOS transistors MP10, MP11, MP12 and MP13 and NMOS transistors MN10, MN11, MN12 and MN13. Transistors MP10 and MN10 serve as input inverter and transistors MP13 and MN13 serve as output inverters. Input signal LS_I is fed to a gate of MN12, and the inverted input signal inverted by transistors MP10 and MN10 is fed to a gate of transistor MN11. A load terminal of transistor MN11 is coupled with node K10, while a node terminal of transistor MN12 is coupled with node K12. PMOS transistors MP11 and MP12 are cross coupled similar to transistors MP2 and MP3 of the embodiments of FIGS. 4-11. Node K12 is coupled with the gate of transistors MP13 and MN13, i.e. with the above-mentioned output inverter.

The general operation of the level shifter of FIG. 12 is similar to the one already described with reference to FIGS. 4 and 10 for the case when VDD is present. When VDD is not present, LS_O does not necessarily assume a defined state. Because in the embodiment of FIG. 12 the gate of MN12 is coupled with the non-inverted input LS_, whereas in the embodiments of FIGS. 4-11 the corresponding transistor MN2 is coupled to the inverted input signal, the level shifter of FIG. 12 generally is a non-inverting level shifter. In other words, when LS_I corresponds to a logical one, also LS_O corresponds to a logical one, and if LS_I corresponds to a logical zero, also LS_O corresponds to a logical zero. However, similar to the embodiment of FIG. 10, the level shifter of FIG. 12 may also be designed as an inverting level shifter.

Figure 13:
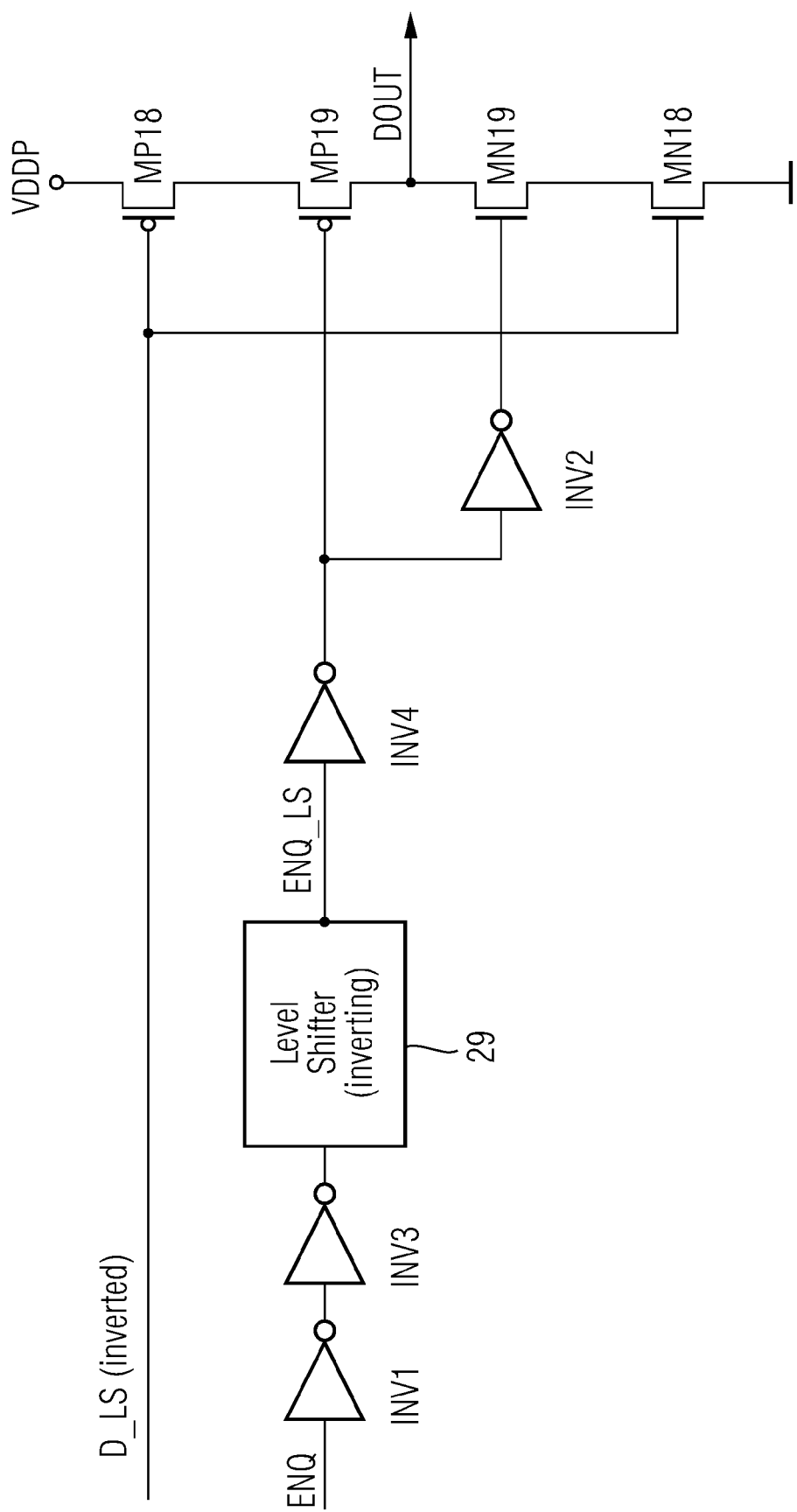
FIG. 13 is a diagram of an illustrative embodiment showing the coupling of a level shifter to a driver.
Figure 14:
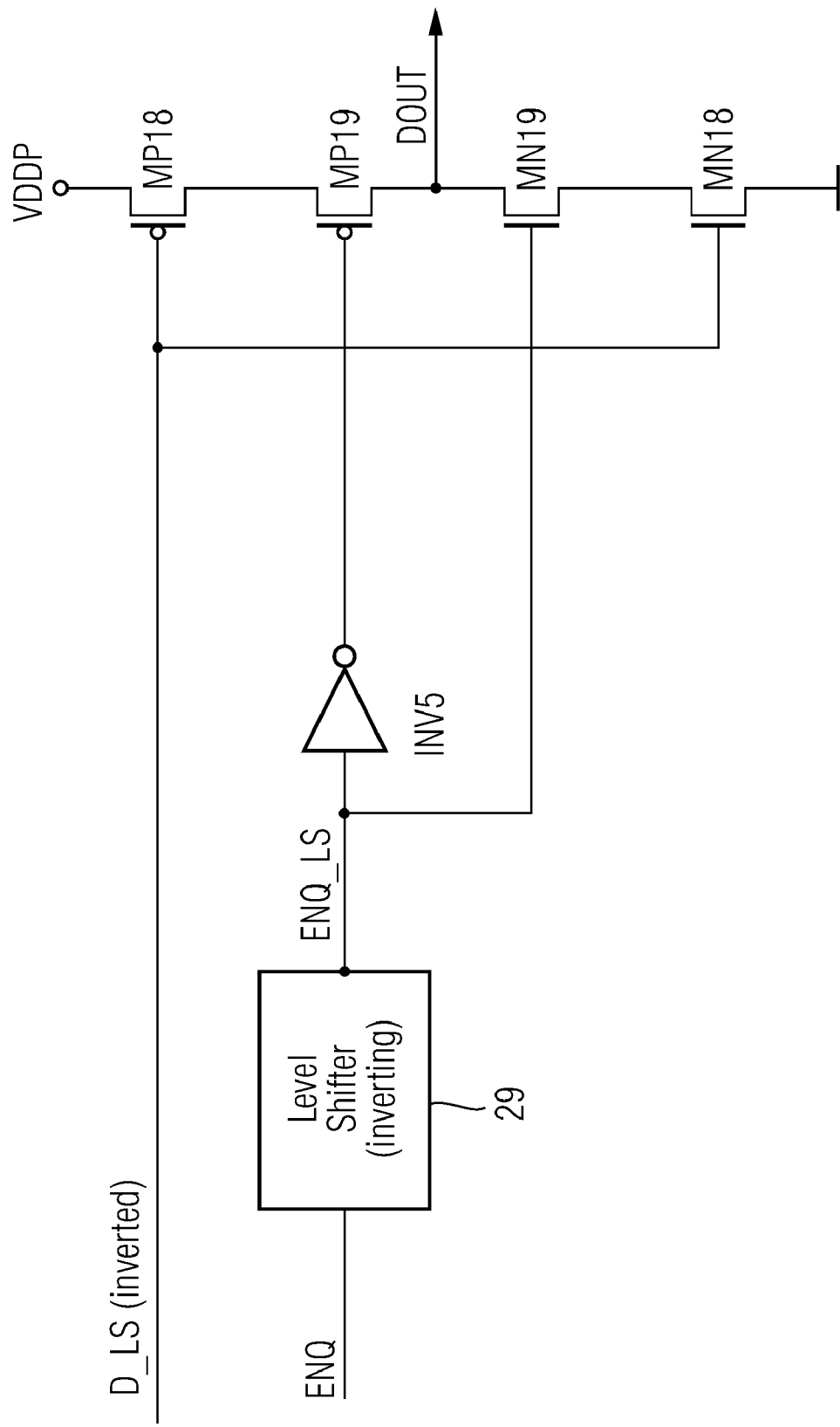
FIG. 14 is a diagram of another illustrative embodiment of the coupling of a level shifter to a driver.
Figure 15:
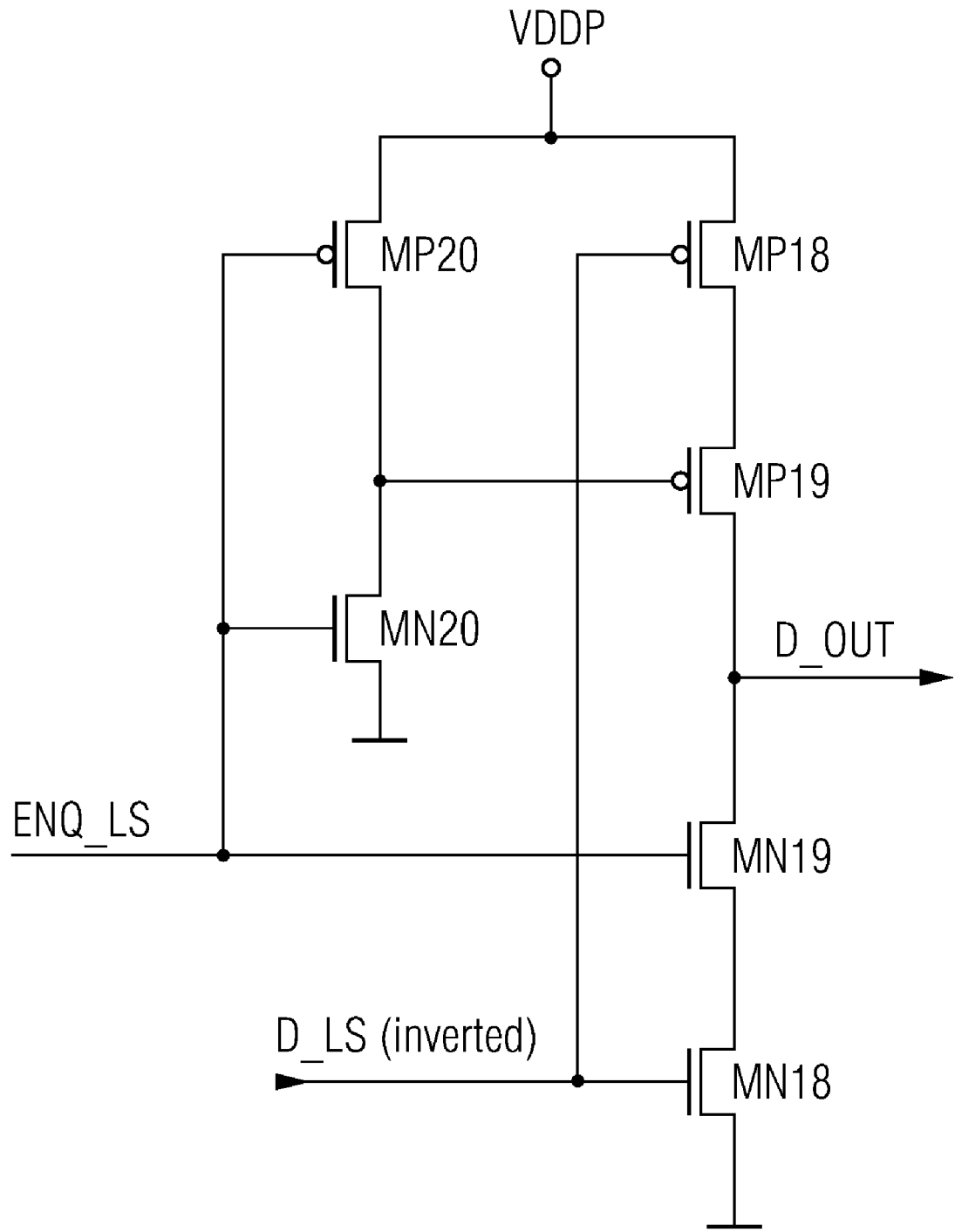
FIG. 15 shows a circuit diagram of a driver according to an illustrative embodiment.

Next, with reference to FIGS. 13-15, illustrative embodiments of a driver circuit and the coupling of a level shifter to such a driver will be discussed. The embodiments which will be discussed with reference to FIGS. 13-15 may for example be used in the embodiment of FIG. 2, where two level shifters 20, 21 are coupled with driver 22.

In the embodiment of FIG. 13, a driver circuit includes two PMOS transistors MP18 and MP19 the load sections (i.e. the paths between a first load terminal and second load terminal or between source and drain) are coupled in series between VDDP and an output of the driver labeled DOUT. Furthermore, the driver includes two NMOS transistors MN18 and MN19 the load sections of which are connected in series between ground and the above-mentioned output DOUT as shown in FIG. 13.

In the embodiment of FIG. 13, the driver is enabled, i.e. basically switched on, controlled by an enabling signal ENQ received for example from a circuit core like in the embodiment of FIG. 2. In the embodiment of FIG. 13, it is assumed that an enabling signal ENQ of a logical one (or VDD) is used to switch the driver to a high impedance state (tri-state) which basically corresponds to a switched off state, while a value ENQ of low (or ground) is used to put the driver in an active state in which the output signal DOUT is determined by an input signal labeled D_LS in FIG. 13.

In the embodiment of FIG. 13, an inverting level shifter 29 is used to level shift the enable signal ENQ to a level shifted enable signal ENQ_LS. In various embodiments, the level shifter 29 may be a level shifter as described with reference to FIGS. 4-11, wherein in case of the embodiments of FIGS. 8-9, which both have an inverted an a non-inverted output, the inverted output LSQ_O may be used. In these embodiments, the level shifter outputs a logical zero when VDD is not present.

In the embodiment of FIG. 13, enable signal ENQ is supplied to level shifter 29 via two inverters INV1, INV3 coupled in series so that the original (non inverted) signal ENQ is supplied to the level shifter 29. As further shown in FIG. 13, the level shifted enabling system ENQ_LS output by level shifter 29 is fed via an inverter INV4 to a gate of PMOS transistor MP19 and via inverter INV4 and a further inverter INV2 to a gate of NMOS transistor MN19.

Because level shifter 29 is also inverting, when signal ENQ is at a logical one (corresponding to a desired switch off of the driver), signal ENQ_LS is at a logical zero. The same, as previously discussed, holds true if VDD is not present. In this case, in the circuit of FIG. 13, a logical one is supplied to the gate of PMOS MP19, and a logical zero is supplied to the gate of NMOS MN19. This puts both PMOS MP19 and NMOS MN19 in a high impedance state, effectively decoupling VDDP, the output DOUT and ground from each other. In other words, the driver is switched to a high impedance tri-state.

On the other hand, if ENQ is at a logical zero (intended to enable the driver), then ENQ_LS is high and correspondingly MP19 and MN19 are switched on.

As shown in FIG. 13, a level shifted data signal D_LS is supplied to gates of transistors MP18 and MN18. In the embodiment of FIG. 13, it is assumed that the data signal D_LS also has been level shifted by an inverting level shifter, such that an original data signal of a logical one corresponds to a signal D_LS of a logical zero and an original data signal of a logical zero leads to a level shifted data signal D_LS of a logical one. If in the state when the driver is enabled (i.e. transistors MP19 and MN19 are conducting), then a signal D_LS of a logical one places PMOS MP18 in a high impedance state and NMOS MS18 in a low impedance state such that DOUT corresponds to ground or a logical zero. Conversely, a signal D_LS corresponding to a logical zero places PMOS MP18 in a low impedance state and MN18 in a high impedance state such that in this case DOUT corresponds to VDDP or a logical one. In other words, the driver when enabled acts as an inverter for D_LS.

In FIG. 14, an alternative illustrative configuration to the embodiment of FIG. 13 is shown. In contrast to FIG. 13, the two inverters INV1 and INV3 performing a double inversion of enable signal ENQ have been omitted in FIG. 14. Furthermore, in the embodiment of FIG. 14, inverters INV4 and INV2 have been replaced by an inverter INV5 that does not change the states of the signals supplied to the gate of MP19 and MN19. In comparison, in FIG. 13, the gate of MN19 is connected via no inverter instead of two inverters with the output of level shifter 29, and the gate of MP19 is still connected via one inverter with the output of level shifter 29.

It should be noted that the embodiments of FIGS. 13 and 14 serve only as examples, and many other configurations are possible in other embodiments. For example, when instead of an inverting level shifter 29, a non-inverting level shifter is used that outputs a logical one instead of a logical zero when VDD is not present, (for example in case the non-inverted output LS_O of the embodiments of FIG. 8 or 9 are used), an additional inverter at the output of the level shifter may be provided such that the functionality remains unchanged. Since two inverters in series generally correspond to no inverter, in the embodiment of FIG. 14 placing an additional inverter at the output of a level shifter would correspond to changing the position of inverter INV5 such that it is placed between the level shifter and transistor MN19 instead of between the level shifter and transistor MP19. Similar considerations apply if a level shifter used for generating the signal D_LS is a non-inverting level shifter or if the signal D_LS is not supplied by a level shifter, but is rather a signal with the desired voltage level generated by another circuit. Also, since the switching behavior of a PMOS transistor basically corresponds to the switching behavior of an NMOS transistor with an inverter at its gate, the driver may be constructed of PMOS transistors and/or NMOS transistor in a different manner than shown.

FIG. 15 shows a possible implementation combining inverter INV5 with the driver including transistors MP18, MP19, MN19 and MN18. In this case, inverter INV5 basically is realized by an inverter having a PMOS transistor MP20 and an NMOS transistor MN20 as shown in FIG. 15.

It should be noted that the application of the level shifters of the embodiments of FIGS. 3-12 is not limited to the embodiments of FIGS. 2 and 13-15, but generally may be employed in any situation where level shifting is needed, for example as depicted in the embodiment of FIG. 1. Furthermore, while a plurality of level shifters according to different embodiments have been discussed, further modifications and variants may be implemented in other embodiments without departing from the scope of the present invention. For example, while the embodiments of FIGS. 4-15 are based on MOS transistors, in various embodiments other types of field-effect transistors, e.g. JFETs (Junction Field Effect Transistors) or bipolar transistors may be used. In still other embodiments, different types of transistors may be used in combination. In yet other embodiments, for example embodiments where, as indicated already with reference to FIG. 1, VDDA is equal to VDDB and VSSA is unequal to VSSB, the polarity of transistors used in a corresponding level shifter may be reversed compared to the embodiments of FIGS. 4-11. Further, while in the circuit of FIG. 2, e.g., VDD is smaller than VDDP, in other embodiments a supply voltage connected to an input circuit of a level shifter may be greater than a supply voltage connected to an output circuit of a level shifter. In particular, the above-described embodiments are not intended to be construed as limiting the scope of the present invention. Rather, the scope of the present invention is intended to be defined only by the appended claims and equivalents thereof.

What is claimed is:

1. A level shifter, comprising:
an input circuit comprising a signal input configured to receive an input signal, and a first voltage input coupled with a first supply voltage;
an output circuit comprising a signal output configured to output an output signal, and a second voltage input coupled with a second supply voltage different from said first supply voltage; and
at least one switch coupled between said input circuit and said output circuit and controlled by said first supply voltage such that said at least one switch is configured to (a) couple said input circuit with said output circuit responsive to said first supply voltage being applied to said at least one switch and to (b) decouple said input circuit from said output circuit responsive to said first supply voltage not being applied to said at least one switch,
wherein said level shifter is configured to generate said output signal based on said input signal through level shifting when said at least one switch establishes a connection from said input circuit to said output circuit,
wherein said output circuit is configured such that said signal output assumes a predetermined state responsive to said input circuit being decoupled from said output circuit by said at least one switch,
wherein said output circuit comprises a first transistor and a second transistor, a first load terminal of said first transistor and a first load terminal of said second transistor are coupled with said second voltage input, a second load terminal of said first transistor and a control terminal of said second transistor are coupled with a first circuit node, a second load terminal of said second transistor and a control terminal of said first transistor are coupled with a second circuit node, and at least one circuit node chosen from the group consisting of said first circuit node and said second circuit node is coupled with a switch of said at least one switch, and
wherein said level shifter further comprises a discharge path coupled with said first circuit node and a control circuit configured to activate said discharge path based on a state of said first voltage input and a state of said signal output.

2. The level shifter of claim 1, wherein said at least one switch comprises a transistor having a first load terminal, a second load terminal, and a control terminal, the first load terminal is coupled with said input circuit, the second load terminal is coupled with said output circuit, and the control terminal is coupled with said first supply voltage.

3. The level shifter of claim 1, wherein said input circuit comprises an inverter having an input, the input of said inverter being coupled to said signal input.

4. The level shifter according to claim 3, further comprising a transistor comprising a load terminal and a control terminal, wherein said at least one switch comprises a first switch and a second switch, said inverter comprises an output, the output of said inverter is coupled with said first switch and the control terminal, and the load terminal is coupled with said second switch.

5. The level shifter according to claim 3, wherein said input circuit further comprises a first transistor and a second transistor each comprising a load terminal and a control terminal, the at least one switch comprises a first switch and a second switch, the load terminal of said first transistor is coupled with the first switch, the load terminal of said second transistor is coupled with the second switch, the control terminal of said first transistor is coupled with said signal input, and the control terminal of said second transistor is coupled with an output of said inverter.

6. The level shifter of claim 1, wherein said output circuit further comprises an inverter, an input of said inverter being coupled with one of said first circuit node and said second circuit node, and an output of said inverter being coupled with said signal output.

7. The level shifter of claim 1, wherein said first circuit node is coupled with a reference potential via a switchable circuit path, said switchable circuit path configured to be activated during at least one event chosen from the group consisting of a switching off of said second supply voltage and a switching on of said second supply voltage.

8. The level shifter of claim 7, wherein said reference potential is ground.

9. The level shifter of claim 1, wherein said second circuit node is coupled with said second voltage input via a switchable circuit path, said switchable circuit path configured to be activated during at least one event chosen from the group consisting of a switching off of said second supply voltage and a switching on of said second supply voltage.

10. An apparatus, comprising
a first electronic circuit configured to be coupled to a first supply voltage and comprising a first output;
a second electronic circuit configured to be coupled to a second supply voltage and comprising a first input;
a first level shifter, comprising:
a signal input coupled with said first output of said first electronic circuit,
a signal output coupled with said first input of said second electronic circuit,
an input circuit comprising said signal input and a first voltage input configured to be coupled with said first supply voltage, an output circuit comprising said signal output and a second voltage input configured to be coupled with said second supply voltage, and a switch coupled between said input circuit and said first output circuit and configured to be controlled by said first supply voltage such that said at least one switch couples said input circuit with said output circuit responsive to said first supply voltage being present and decouples said input circuit from said output circuit responsive to said first supply voltage not being present; and a voltage regulator having an input, wherein the input of said voltage regulator is configured to be coupled to said second supply voltage, and said voltage regulator is configured to derive said first supply voltage from said second supply voltage, wherein said output circuit is configured such that said signal output assumes a predetermined state responsive to said input circuit being decoupled from said output circuit by said switch.

11. The apparatus of claim 10, wherein said first electronic circuit comprises a core of a circuit and said second electronic circuit comprises an output driver of said circuit.

12. The apparatus of claim 11, wherein said first electronic circuit is configured to output an enable signal at said first output, and said output driver is configured to activate and deactivate depending upon said enable signal.

13. The apparatus of claim 10, further comprising a second level shifter, wherein said first electronic circuit comprises a second output, said second electronic circuit comprises a second input, and the second output is coupled with said second input via said second level shifter.

14. A method for operating a level shifter, said level shifter being coupled to a first supply voltage and a second supply voltage different from said first supply voltage, said method comprising:

detecting whether said first supply voltage is present; and decoupling an input of said level shifter from an output of said level shifter responsive to (1) detecting that said first supply voltage is not present and (2) a level of said output.

15. The method of claim 14, further comprising:

detecting a switching on of said second supply voltage; and setting a circuit node of said level shifter to a predetermined potential responsive to detecting the switching on of said second supply voltage.

16. The method of claim 14, further comprising:

detecting a switching off of said second supply voltage; and setting a circuit node of said level shifter to a predetermined potential responsive to detecting the switching off of said second supply voltage.

17. The method of claim 14, further comprising:

decoupling said input from said output; and responsive to said input being decoupled from said output, setting said output to a predetermined state.

* * * * *